United States Patent [19]

Toumani

[11] 3,919,654

[45] Nov. 11, 1975

[54] SYLLABIC COMPANDOR

[75] Inventor: Rouben Toumani, Flanders, N.J.

[73] Assignee: Bell Telephone Laboratories, Incorporated, Murray Hill, N.J.

[22] Filed: Aug. 14, 1974

[21] Appl. No.: 497,136

[52] U.S. Cl. .................. 330/29; 330/30 D; 330/85; 330/133; 330/134; 330/136

[51] Int. Cl.[2] .......................................... H03G 3/30

[58] Field of Search ....... 330/29, 30 D, 69, 85, 133, 330/134, 136; 179/1 L, 1 VL; 333/14

[56] References Cited

UNITED STATES PATENTS

| | | | |
|---|---|---|---|
| 2,179,414 | 11/1939 | Kunkle | 330/85 X |
| 2,576,145 | 11/1951 | Rudkin | 330/85 X |
| 2,903,522 | 9/1959 | Flower | 330/85 X |
| 3,550,028 | 12/1970 | Dilley et al. | 330/29 |
| 3,581,223 | 5/1971 | Armstrong | 330/29 |
| 3,676,789 | 7/1972 | Bray | 330/29 |
| 3,727,146 | 4/1973 | Hughes | 330/29 |

OTHER PUBLICATIONS

Dobkin, "Instrumentation Amplifier," EEE, Vol. 17, No. 6, June 1969, pp. 129, 130.

Carter et al., "Applications of Compandors to Telephone Circuits," 4IEE Transactions Vol. 65, 1946, pp. 1079–1087.

Carter, "Theory of Syllabic Compandors," Pruc. IEE, Vol. 111, No. 3, Mar. 1964, pp. 503–513.

Boyd et al., "The N2 Carrier Terminal–Objectives and Analysis," The Bell System Technical Journal, Vol. XLIX No. 5, May–June 1965, pp. 731, 761–785.

*Primary Examiner*—James B. Mullins
*Attorney, Agent, or Firm*—R. O. Nimtz

[57] ABSTRACT

A novel structure of an operational amplifier with a feedback differential amplifier connected between the operational amplifier output and input and with a feedforward differential amplifier connected between signal input and the input of the operational amplifier, results in a circuit gain which is the ratio of the gains of the two differential amplifiers. Temperature variations are cancelled because gain is a ratio of similar transistor differential pairs. Current sources placed in the emitter circuit of each differential pair provide gain control. Compression results when the current source of the feedback differential pair is varied in proportion to the amplitude of the alternating output signal, while maintaining the current source of the feed-forward differential pair constant. Expansion is achieved by varying the current source of the feed-forward differential pair in proportion to the amplitude of the alternating input signal while maintaining the current source of the feedback differential pair at a constant level.

12 Claims, 8 Drawing Figures

COMPRESSION

EXPANSION

SYLLABIC COMPANDOR

BACKGROUND OF THE INVENTION

1. Field of the Invention

This invention generally relates to variable gain amplifiers and in particular to a compandor amplifier which includes a compressor and an expandor.

2. Description of the Prior Art

A compandor consists of two circuits, a compressor and an expandor. A compressor compresses the dynamic range of alternating signal at the transmitting end before they are modulated and transmitted by a carrier signal over a transmission path. An expandor circuit expands the dynamic range of the alternating signal at the receiving end after it has been demodulated from the carrier.

A compressor has a gain which is dependent on the level of the input signal: higher gain for low level signals, lower gain for high level signals. This increases the level of the lowest-volume signals to a point where they are much less susceptible to noise interference which may be picked up in subsequent transmission over the transmission path.

Prior art compandor circuits are characterized by a variable impedance in the signal path, called a variolosser, followed by an amplifier stage. The output level of the amplifier is detected and filtered to yield a signal proportional to the output signal level. The resulting signal is used to vary the impedance of the variolosser to achieve compression. Similarly, for expansion the level of the input signal is used to vary the impedance of the variolosser. Compandor circuits of this type are described in an article by W. R. Lundry and L. F. Willey entitled, "The N2 Carrier Terminal — Circuit Design," *Bell System Technical Journal*, Vol. XLIV, No. 4, April 1965 at p. 765.

Prior art arrangements for compandor circuits are shown in FIG. 1. FIG. 1A shows the compressor where a variable impedance circuit 100 called a variolosser is placed in the feed-forward signal path and followed by an amplfier 101. The variolosser impedance is controlled by a direct current signal which results from rectifier 102 which rectifies the output signal level following the amplifier. When the signal being compressed is a voice signal, e.g., when the circuit is used in telephone carrier circuits, the rectified signal corresponds to the level of human speech syllables and hence the designation "syllabic compandor." Compression occurs because low level signals are amplified more than high level signals. The shunt impedance of variolosser 100 is higher for low level signals than for high level signals.

FIG. 1B shows the expandor which is complimentary to the compressor. The variolosser 103 provides a variable impedance in the feed-forward signal path. The impedance of the variolosser 103 is controlled by a signal from rectifier 104 which is proportional to the level of the audio signal which had been previously compressed, modulated, transmitted, and demodulated. Amplifier 105 follows the variolosser 103 in the signal path. Expansion occurs because low level signals are amplified less than high level signals. The attenuation of variolosser 103 is higher for low level signals than for high level signals.

Circuits using variable impedance variolossers are expensive because a pair of diodes, critical to the operation of the circuit, must be carefully selected to achieve a given small signal impedance as a function of direct current. In addition, variolossers have a small signal impedance which is proportional to absolute temperature.

In order to overcome these prior art difficulties the following are the objectives of this invention:

to provide a compandor circuit the gain of which is characterized by passive components, to provide a compandor circuit which does not require the use of selected diodes as in a variolosser circuit, and to provide a compandor circuit with high gain stability due to temperature variations.

It is a further object of this invention to provide a compandor circuit which can be easily fabricated as an integrated circuit.

It is a still further object of this invention to provide a single integrated circuit design which can be connected either as a compressor or as an expandor.

SUMMARY OF THE INVENTION

A compandor circuit is disclosed to compress the dynamic range of an information signal prior to modulation and transmission in a carrier transmission system and to expand the dynamic range of a received signal after demodulation. The alternating signal to be compressed or expanded is applied to an input differential amplifier with a current source connected between the common emitters of the differential pair and ground. The differential output of the input differential amplifier is applied to an operational amplifier. The output of the operational amplifier is applied to a feedback differential amplifier with another current source connected between the common emitters of the differential pair and ground. The output of the feedback differential amplifier is applied to the input of the operational amplifier. Negative feedback around the infinite gain operational amplifier assures that the voltage difference from the output of each differential pair is the same. This fact assures that gains due to the temperature variations of the transistors used in the differential amplifiers cancel each other.

The compressor circuit is obtained by varying the current source of the feedback amplifier in accordance with the level of the output signal from the operational amplifier while maintaining the current source of the input differential amplifier at constant level. The expandor circuit is obtained by varying the current source of the input differential amplifier in accordance with the level of the input signal to the expandor, while maintaining the current source of the feedback differential amplifier at a constant level.

DETAILED DESCRIPTION

Figure 1A:
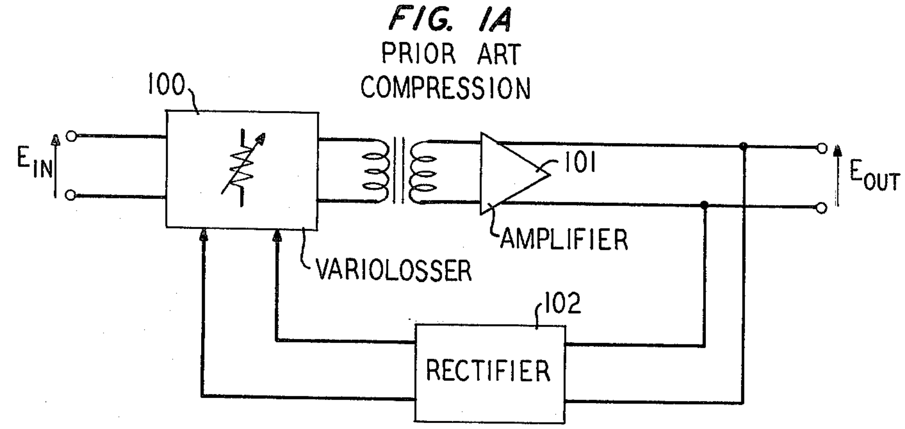
FIG. 1A PRIOR ART
FIGS. 1A & B shows prior art compressor and expandor circuits.
Figure 1B:
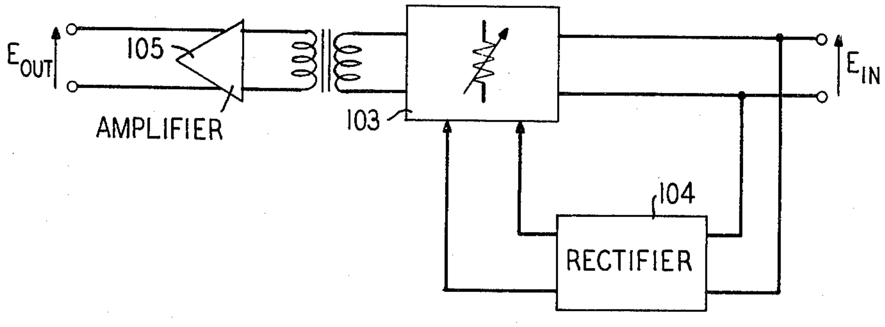
FIG. 1B PRIOR ART
Figure 2:
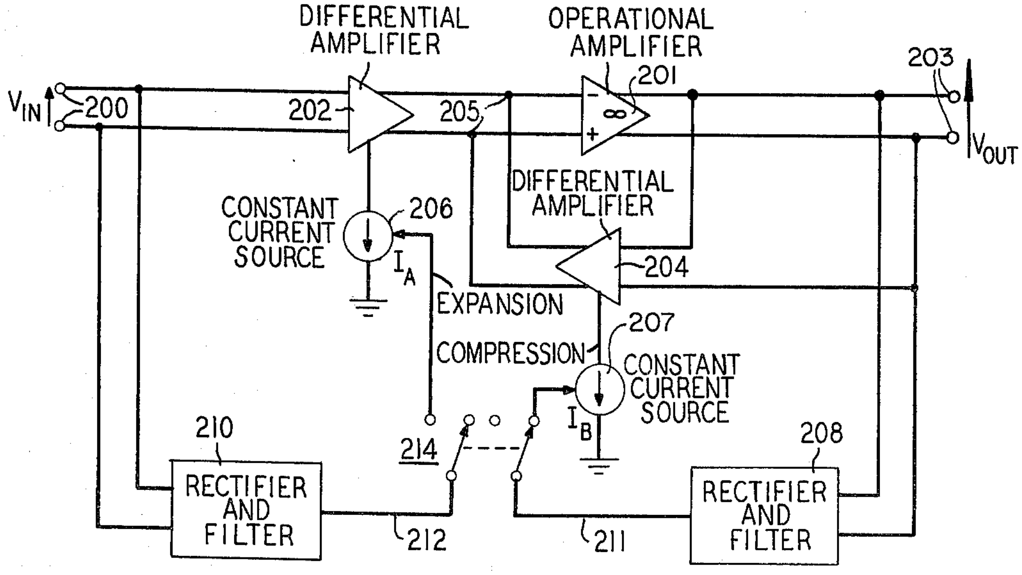
FIG. 2 shows a block diagram of the circuit diagram of a novel compandor.

A novel compandor is shown in block diagram form in FIG. 2. A differential amplifier 202 using transistors as active elements is placed in the signal path between input terminals 200 and the input terminals 205 of an operational amplifier 201. Another transistorized differential amplifier 204 is placed in the feedback path around the operational amplifier 201. Differential amplifier 204 is connected between output terminals 203 and the operational amplifier input terminals 205.

The gains of differential amplifiers 202 and 204 are controlled by separate constant current sources, $I_A$ source 206 and $I_B$ source 207, respectively. Rectifier 208 detects the output signal level on output leads 203 and produces a signal on lead 211 proportional to the output level. Rectifier 210 detects the input level on input leads 200 and produces a signal on lead 212 proportional to the input signal level. Connected by switch 214 as a compressor, the output from rectifier 208 is used to vary constant current source 207 by means of lead 211. Lead 212 is disconnected, leaving constant current source 206 to remain at a constant level. Connected by switch 214 as an expandor, the output from rectifier 210 is used to vary constant current source 206, by means of lead 212. Lead 211 is disconnected leaving constant current source 207 to remain at a constant level.

Figure 3:
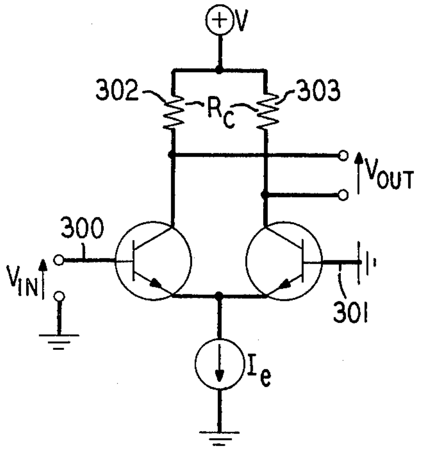
FIG. 3 shows a schematic diagram of a differential amplifier.
Figure 4:
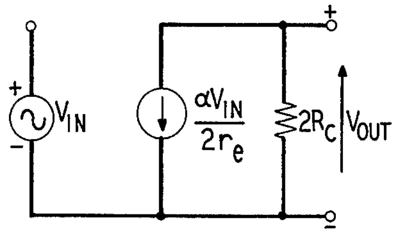
FIG. 4 shows a small signal alternating current model for a differential amplifier.

A typical transistorized differential amplifier is shown in FIG. 3. A varying signal to be amplified is applied to the base 300 of one transistor connected in a common emitter differential gain configuration. The base of the second transistor 301 is grounded. Reload resistors 302, 303 are placed in the collector circuits of each transistor. A small signal alternating current model of the transistor differential gain is shown in FIG. 4. It can be shown that the gain of the amplifier is inversely proportional to the emitter resistance $r_e$, $$\frac{V_{out}}{V_{in}} \sim \frac{K_i}{r_e} \quad (1)$$

where $K_i$ is a constant. The emitter resistance is in turn, proportional to temperature and emitter current, $$r_e \sim \frac{K_B T}{q I_e} \quad (2)$$

where $K_B$ is Boltzman's constant, $q$ is charge in coloumbs, and $T$ is absolute temperature. Gain for the differential pair of FIG. 3 is seen to be directly proportional to emitter current, and inversely proportional to temperature, $$\frac{V_{out}}{V_{in}} \sim \frac{K I_e}{T} \quad (3)$$

where $K$ is a constant related to $K_i$, $K_B$, and $q$.

Turning again to FIG. 2, it is seen that current sources 206 and 207 directly control the gain of each transistor differential pair. The operational amplifier 201, because of its high gain with negative feedback, forces the voltage difference at its input terminals to be negligible. Thus the output voltage from differential amplifier 202 and the output voltage from differential amplifier 204 must be the same, $$V_{in} K_1 \frac{I_A}{T} = V_{out} K_2 \frac{I_B}{T} \quad (4)$$

The gain for the entire circuit is $$\frac{V_{out}}{V_{in}} = K_3 \frac{I_A}{I_B} \quad (5)$$

where $K_3$ is a constant depending on the values of $K_1$ and $K_2$. It is apparent from equation (5) that the overall small signal gain of the circuit of FIG. 2 is independent of temperature.

For compression, current source 206 is made a constant value by supplying a fixed current source. Current source 207 is varied in proportion to the rectified and filtered voltage appearing on lead 211 which is proportional to the signal level appearing on output terminals 203. For expansion, current source 207 is made a constant value by supplying a fixed current source. Current source 206 is varied in proportion to the rectified and filtered voltage appearing on line 212, which is proportional to the signal level appearing on input terminals 200. For compression, $$V_{out} \sim \frac{K}{V_{out}} V_{in}, \quad (6)$$

where $V_{out}$* represents the steady state signal level of the output voltage. Thus the steady state input-output relationship for the compressor is $$\frac{V_{out}}{V_{in}} \sim \frac{K}{V_{out}} \quad (7)$$

For expansion, $$V_{out} \sim K V_{in} V_{in}, \quad (8)$$

where $V_{in}$* represents the steady state signal level of the input voltage. The steady state input-output relationship for the expandor is $$\frac{V_{out}}{V_{in}} \sim K V_{in}^* \quad (9)$$

The signal gain for a signal which is first compressed, and then transmitted, then expanded is found by the product of equations (7) and (9) where the output voltage of equation (7) becomes the input voltage of equation (9)

$$V^*_{out_{exp}} = K V^*_{out_{comp}} K (V^*_{in_{comp}}{}^{1/2})^2 = K V^*_{in_{comp}}. \quad (10)$$

Figure 5:
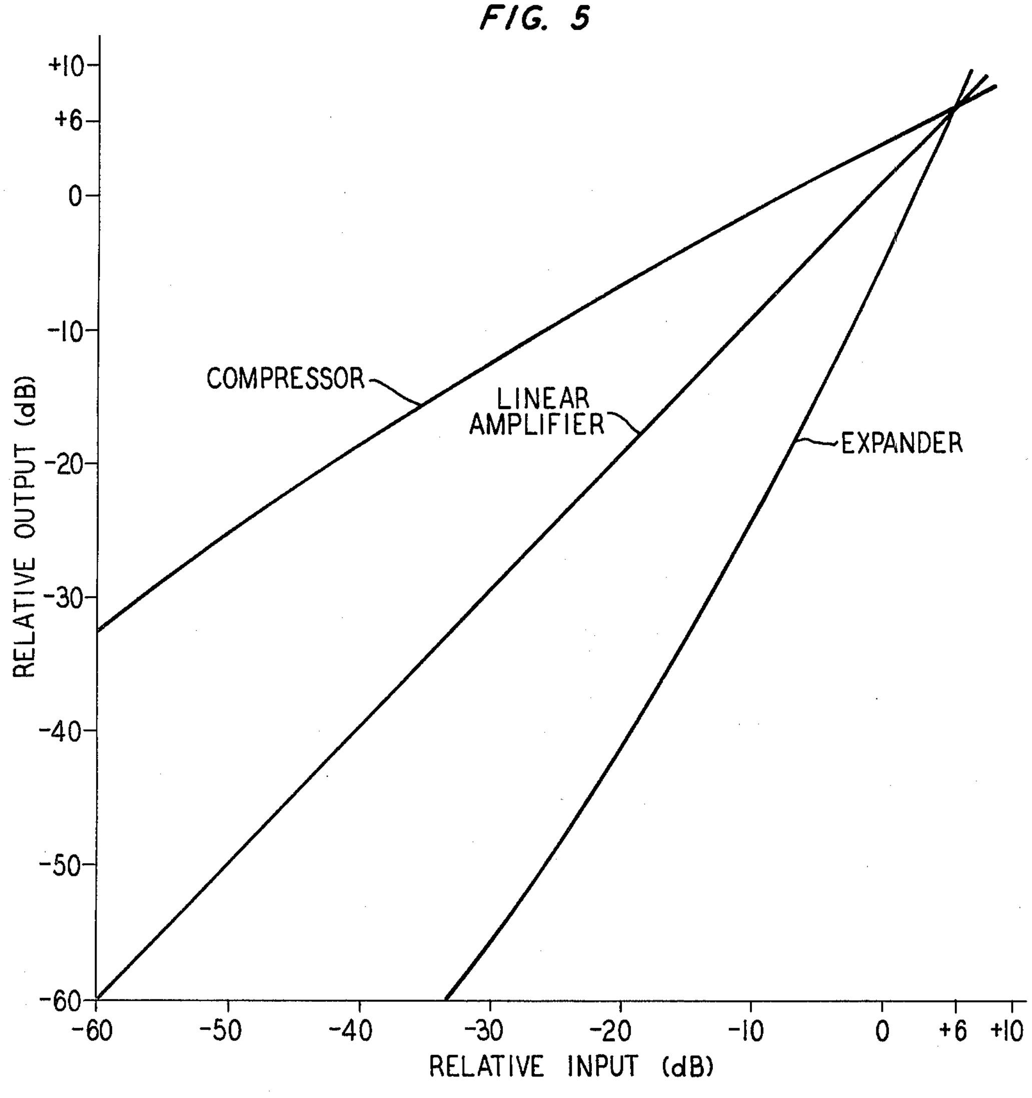
FIG. 5 shows input-output relatonships for a compressor, an expandor and a linear amplifier.

When expressed in decibels, where voltages are measured logarithmetically, the slope gain line on output-input axes is one-half for the compressor and two for the expandor. Three gain lines are shown in FIG. 5, as well as the gain line for the overall linear amplifier expressed by equation (10).

Figure 6:
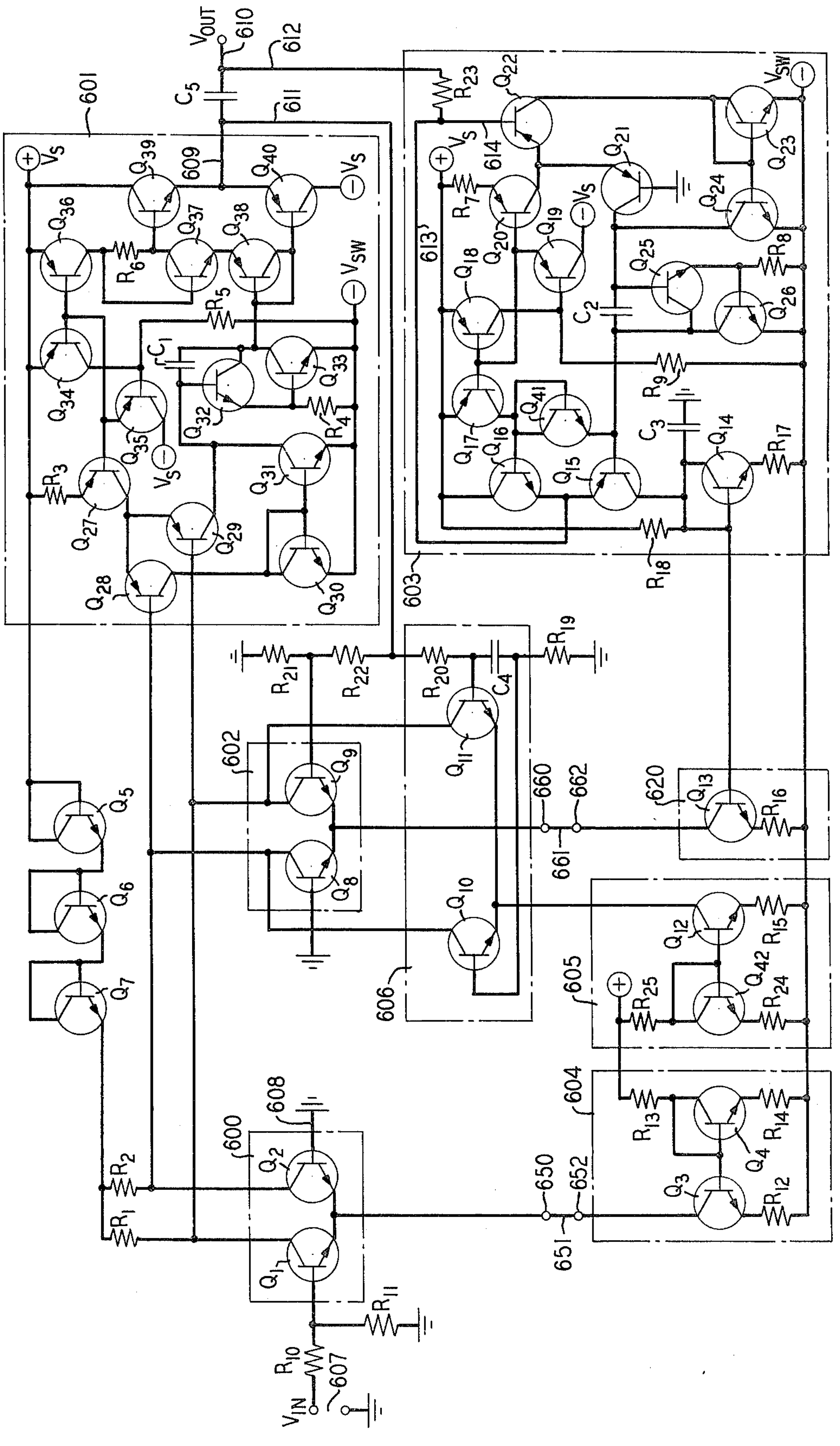
FIG. 6 shows a schematic diagram of the compressor.

A detailed compressor circuit is shown in FIG. 6. The feed-forward differential amplifier pair is shown within dashed lines 600. The feedback differential pair is shown within dashed lines 602. The operational amplifier is shown within dashed lines 601. A detector consisting of a half-wave rectifier and lowpass filter is shown within dashed lines 603. A fixed current source for the emitter circuit of the feed-forward differential pair is shown within dashed lines 604. A variable current source proportional to the output signal level is placed in the emitter circuit of the feedback differential pair and is shown within dashed lines 620. An additional differential pair shown within dashed lines 606 is used to provide direct current feedback around the operational amplifier to minimize offset direct current voltages at the output of the operational amplifier. This direct current feedback stage is of essential importance since large direct current voltages at the output of the operational amplifier would introduce a corresponding offset voltage at the input of the feedback differential pair and hence would deteriorate the accuracy of the circuit. A constant current source within dashed lines 605 is used to control gain of the direct current feedback differential amplifier shown within lines 606.

An audio frequency signal is input to the compressor on the input terminals 607. A voltage divider made up of resistors $R_{10}$ and $R_{11}$ is used to control the end-to-end gain level of the amplifier and also to reduce the input signal level thereby preventing distortion. The input signal, divided by resistors $R_{10}$ and $R_{11}$ is applied to one transistor $Q_1$ of the input differential pair while the other transistor $Q_2$ has its input grounded from lead 608. Resistors $R_1$ and $R_2$ serve as biasing and load resistors for transistors $Q_1Q_2$, $Q_8Q_9$, and $Q_{10}$ $Q_{11}$. Transistors $Q_5$, $Q_6$, and $Q_7$ are connected as diodes and serve to properly bias the three differential pairs shown in dashed lines 600, 602 and 606.

Transistors $Q_{28}$ and $Q_{29}$ serve as the differential gain stage for the operational amplifier shown within dashed lines 601. Transistor $Q_{27}$ and resistor $R_3$ are connected in the emitter circuit of the $Q_{28}Q_{29}$ pair and serve as a current source which control the gain of the $Q_{28}Q_{29}$ pair. Transistor $Q_{30}$, connected as a diode and matching transistor $Q_{31}$, serves as an active load which balances the bias currents for the $Q_{28}Q_{29}$ pair. Capacitor $C_1$ acts to decrease high frequency gain and hence aids in the stability of the operational amplifier. An emitter follower in the form of transistor $Q_{32}$ with resistor $R_4$ in its emitter circuit is followed by transistor $Q_{33}$ to provide a Darlington stage of amplification following the differential pair, $Q_{28}Q_{29}$. Resistor $R_5$, and transistors $Q_{34}$ and $Q_{35}$ are connected to act as a current source for biasing transistors $Q_{27}$ and $Q_{36}$. Resistor $R_6$ and transistors $Q_{37}$ and $Q_{38}$ provide biasing for $Q_{39}$ and $Q_{40}$ to minimize crossover distortion when transistors $Q_{39}$ and $Q_{40}$, connected in a push-pull arrangement, conduct alternately positively or negatively. Output from the operational amplifier is taken on lead 609.

The operational amplifier shown in FIG. 6 in dashed lines 601 is one found useful by this applicant, but commercially available operational amplifiers can be used in its place. A suitable operational amplifier for this purpose is the $\mu$A 709 manufactured by Fairchild Semiconductor, Inc., and described in the 1969 Fairchild Semiconductor Data Catalog, Library of Congress Catalog Card Number 68-8780.

Feedback around the operational amplifier is provided by lead 611 which supplies the feedback differential pair 602 with an output voltage divided by voltage divider pair $R_{22}$ and $R_{21}$. Direct current feedback is provided to the direct current differential pair 606 on lead 611 where the alternating current signal is filtered by $R_{20}$ and $C_4$ and $R_{19}$.

The direct current component in the output signal of the operational amplifier 601 which results at lead 609 is blocked by capacitor C5 to yield the overall compressor output signal on lead 610. The alternating current signal on lead 610 is applied to the rectifier and filter circuit 603. The signal on lead 610 is applied to differential pair $Q_{21}Q_{22}$. The differential pair $Q_{21}Q_{22}$ serves as a stage of gain before the signal is later rectified and filtered. Transistor $Q_{20}$ and resistor $R_7$ are connected in the emitter circuit of the $Q_{21}Q_{22}$ pair and serve as a current source which controls the gain of $Q_{21}Q_{22}$. Transistor $Q_{23}$, connected as a diode, and matching transistor $Q_{24}$ serve as an active lead which balances the bias currents for the $Q_{21}Q_{22}$ pair. Capacitor $C_2$ acts to decrease high frequency gain and hence aids in the stability of the gain stage. An emitter follower in the form of transistor $Q_{25}$ with resistor $R_8$ in its emitter circuit is followed by transistor $Q_{26}$ to provide a Darlington stage of amplification following the differential pair $Q_{21}Q_{22}$. Resistor $R_9$, and transistors $Q_{18}$ and $Q_{19}$ are connected to act as a current source for biasing transistors $Q_{20}$ and $Q_{17}$. Transistor $Q_{41}$ provides bias voltage for the operation of transistors $Q_{16}$ and $Q_{15}$. Negative feedback from the emitters of $Q_{15}$ and $Q_{16}$ is provided by lead 613 which maintains the input lead 614 at virtual ground.

Since lead 614 is at virtual ground, the alternating voltage on lead 612 produces an alternating current in resistor $R_{23}$ which flows alternately in each half cycle, either through the emitter of $Q_{15}$ or $Q_{16}$. Hence the current in the collector of $Q_{15}$ is a half-wave rectified version of the alternating voltage on lead 612.

The rectified current is filtered by capacitor $C_3$ and resistor $R_{17}$ in parallel to produce a direct current in resistor $R_{17}$ which is proportional to the alternating current signal level of the voltage on lead 610. Resistance $R_{18}$ is used to provide a bias current for transistor $Q_{13}$ to insure that current flows in $Q_{13}$ even if output signal is zero, so as to maintain a gain level for feedback differential pair 602.

Transistor $Q_{13}$ with the resistor $R_{16}$ in its emitter circuit act as a current repeater producing a current in the emitter circuit of differential pair $Q_8Q_9$ which is proportional to the alternating current signal level of the output voltage on lead 610.

Circuits 604 and 605 act as constant current sources for differential pairs $Q_1Q_2$ and $Q_{10}Q_{11}$. Resistors $R_{13}$ and $R_{14}$ and diode-connected transistor $Q_4$ act as the biasing circuit for transistor $Q_3$. Resistors $R_{25}$ and $R_{24}$ and diode-connected transistor $Q_{42}$ act as the biasing circuit for transistor $Q_{12}$.

Figure 7:
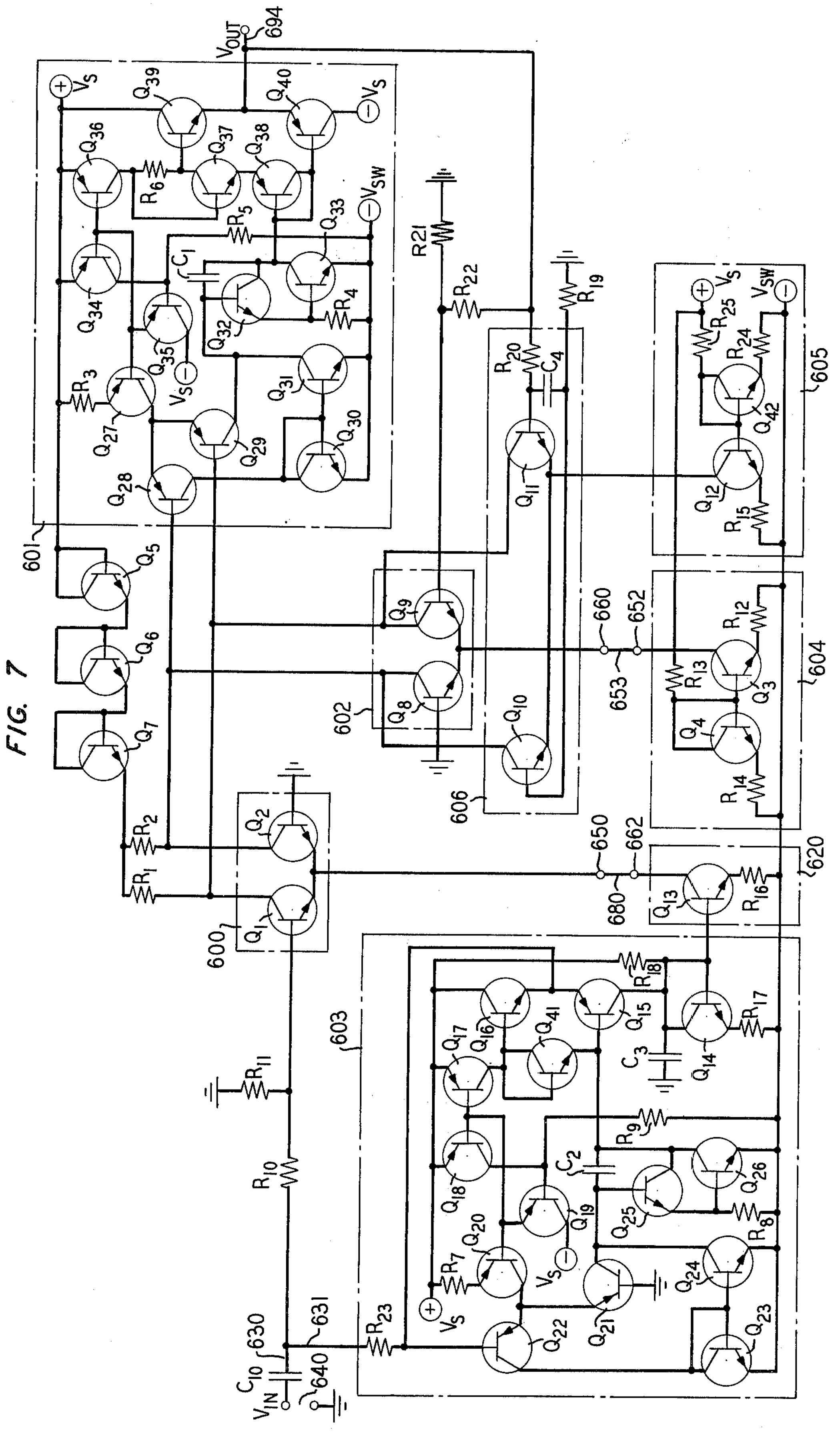
FIG. 7 shows a schematic diagram of the expandor.

The expandor connection for the compandor is shown in FIG. 7. This circuit substantially contains the same components as the compression connection of FIG. 6. The significant difference, of course, is that the input voltage on lead 630 is rectified and filtered by circuit 603 and used to vary the current in current source 620 to control the gain of the feed-forward differential pair $Q_1Q_2$ rather than the feedback differential pair $Q_8Q_9$. For expansion, the constant current source 604 maintains the emitter current, and hence the gain of differential pair $Q_8Q_9$, at a constant level. Capacitor $C_{10}$ is placed between expandor input terminals 640 and the lead 630 to assure that only alternating voltages are impressed to the expandor. Lead 631 carries the input signal to the rectifier-filter circuit 603. Output of the expansion circuit is impressed on lead 694 which is the output of operational amplifier 601.

The particular circuits of FIGS. 6 and 7 are designed to have the same basic components for the compressor and expandor. This feature allows economy of manufacture in that external connections permit easy connection from one circuit to the other. For example, the compressor to FIG. 6 provides the constant current source 604 in the emitter of feed-forward differential pair $Q_1Q_2$ by connecting terminal 650 with terminal 652 by means of lead 651. The constant current source 604 can be placed within the emitter circuit of the feedback differential pair $Q_8Q_9$ by connecting terminal 660 with terminal 652 by means of a lead 653 as shown in FIG. 7. In like manner, for the compressor of FIG. 6 the variable current source 620 is connected to the feedback differential pair $Q_8Q_9$ by connecting terminals 660 and 662 by lead 661. In FIG. 7, the expansion circuit variable current source 620 is connected to the feed-forward differential pair $Q_1Q_2$ by connecting terminals 650 and 662 with lead 680.

What is claimed is:

1. A variable gain amplifier comprising:
an input signal terminal,
an operational amplifier,
a feedback differential amplifier connected between the output and input of the operational amplifier,
a feed-forward differential amplifier connected between the input signal terminal and the input of the operational amplifier,
means for controlling the gain of the feedback differential amplifier, and
means for controlling the gain of the feedforward differential amplifier.

2. A compressor, the gain of which is inversely proportional to the amplitude of the output signal, comprising:
an input signal terminal,
an operational amplifier,
a feedback common emitter differential amplifier connected between the output and input of the operational amplifier,
a feed-forward common emitter differential amplifier connected between the input signal terminal and the input of the operational amplifier,
a variable current source connected in series with the common emitter of the feedback differential amplifier,
means for varying the variable current source in proportion to the amplitude of the alternating current signal at the output of the operational amplifier, and
a constant current source connected in series with the emitter circuit of the feed-forward differential amplifier.

3. The compressor of claim 2 further comprising:
a fixed gain common emitter differential direct current amplifier connected between the output and input of the operational amplifier.

4. The compressor of claim 3 wherein the means for varying the variable current source in proportion to the amplitude of the alternating current signal at the output of the operational amplifier comprises:
a rectifier circuit connected to the output of the operational amplifier, and
a low pass filter connected between the output of the rectifier and the variable current source.

5. An expandor amplifier, the gain of which is directly proportional to the level of the input signal, comprising:

an input signal terminal,
an operational amplifier,
a feedback common-emitter differential amplifier connected between the output and input of the operational amplifier,
a feed-forward common emitter differential amplifier connected between the input signal terminal and the input of the operational amplifier,
a variable current source connected in series with the common emitter of the feed-forward differential amplifier,
means for varying the variable current source in proportion to the amplitude of the alternating current signal appearing on the input signal terminal, and
a constant current source connected in series with the emitter circuit of the feedback differential amplifier.

6. The expandor of claim 5 further comprising a fixed gain common emitter differential direct current amplifier connected between the output and input of the operational amplifier.

7. The expandor of claim 6 wherein the means for varying the variable current source in proportion to the amplitude of the alternating current signal at the input signal terminal comprises:
a rectifier circuit connected to the input signal terminal, and
a low pass filter connected between the output of the rectifier and variable current ssource.

8. A compressor comprising:
an input signal terminal,
an operational amplifier,
a constant gain feed-forward amplifier connected between the input signal terminal and the input of the operational amplifier,
a feedback amplifier connected between the output and input of the operational amplifier, said feed-forward and feedback amplifiers providing compensating variations of gain with temperature, and
means for controlling the gain of the feedback amplifier in proportion to the amplitude of the alternating current signal at the output of the operational amplifier according to the formula $$g = kV_o$$

where $g$ is the gain of said feedback amplifier, $V_o$ is the output voltage from said operational amplifier, and $k$ is a constant.

9. A compandor for analog information signals comprising:
an operational amplifier for said analog information signals,
a first current-controlled differential amplifier interposed in the input to said operational amplifier,
a second current-controlled differential amplifier connected in a feedback path around said operational amplifier, and
means for selectively controlling the current to said first or second differential amplifiers with said analog information signals.

10. The compandor according to claim 9 further comprising:
a syllabic detector connected to control said first differential amplifier by input signals to said first differential amplifier.

11. A compandor according to claim 9 further comprising:
a syllabic detector connected to control said second differential amplifier by output signals from said operational amplifier.

12. A variable gain amplifier of the type having an operational amplifier in the signal path and signal input and output terminals, characterized by a feedback differential amplifier connected between the output and input of the operational amplifier, a feed-forward differential amplifier connected between the input signal terminal and the input of the operational amplifier, a first circuit connected to the signal output terminals for controlling the gain of the feedback differential amplifier, and a second circuit connected to the signal input terminals for controlling the gain of the feed-forward differential amplifier.

* * * * *

UNITED STATES PATENT AND TRADEMARK OFFICE

CERTIFICATE OF CORRECTION

PATENT NO. : 3,919,654

DATED : November 11, 1975

INVENTOR(S) : Rouben Toumani

It is certified that error appears in the above-identified patent and that said Letters Patent are hereby corrected as shown below:

Column 3, line 41 (equation 1), that portion of the equation reading $$\begin{matrix} V_{out} \\ V_{in} \end{matrix} \quad \text{should read} \quad \frac{V_{out}}{V_{in}}$$

Column 4, line 30 (equation 6) reading "$V_{out} \sim \frac{K}{V_{out}} V_{in}$," should read --$V_{out} \sim \frac{K}{V_{out}*} V_{in}$,--; line 36 (equation 7) reading "$\frac{V_{out}}{V_{in}} \sim \frac{K}{V_{out}}$" should read -- $\frac{V_{out}}{V_{in}} \sim \frac{K}{V_{out}*}$ --; line 46 (equation 8) reading "$V_{out} \sim KV_{in} V_{in}$," should read --$V_{out} \sim KV_{in} V_{in}*$,--. Column 7, line 6, "to" should read --of--.

Signed and Sealed this

*sixteenth* Day of *March 1976*

[SEAL]

*Attest:*

RUTH C. MASON
*Attesting Officer*

C. MARSHALL DANN
*Commissioner of Patents and Trademarks*